(12) United States Patent
Bhosle et al.

(10) Patent No.: US 12,165,852 B2
(45) Date of Patent: Dec. 10, 2024

(54) COVER RING TO MITIGATE CARBON CONTAMINATION IN PLASMA DOPING CHAMBER

(71) Applicant: Applied Materials, Inc., Santa Clara, CA (US)

(72) Inventors: Vikram M. Bhosle, North Reading, MA (US); Timothy J. Miller, Ipswich, MA (US); Eric D. Hermanson, Georgetown, MA (US); Christopher J. Leavitt, Gloucester, MA (US); Jordan B. Tye, Arlington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 17/687,620

(22) Filed: Mar. 5, 2022

(65) Prior Publication Data

US 2023/0282451 A1 Sep. 7, 2023

(51) Int. Cl.
*H01J 37/32* (2006.01)

(52) U.S. Cl.
CPC .. *H01J 37/32642* (2013.01); *H01J 37/32412* (2013.01); *H01J 37/32651* (2013.01); *H01J 37/32935* (2013.01)

(58) Field of Classification Search
CPC ........... H01J 37/32642; H01J 37/32623; H01J 37/32412; H01J 37/32724; H01J 37/32935; H01J 37/32963; H01J 37/32651; H01J 37/3299; H01J 37/32082; H01J 2237/34405; H01J 2237/334
See application file for complete search history.

(56) References Cited

U.S. PATENT DOCUMENTS

| | | | |
|---|---|---|---|
| 10,593,520 B2 | 3/2020 | Wu | |
| 2005/0260354 A1* | 11/2005 | Singh | H01J 37/32495 427/523 |
| 2018/0040457 A1* | 2/2018 | Wu | H01J 37/3244 |

FOREIGN PATENT DOCUMENTS

| | | |
|---|---|---|
| CN | 101847559 A | 9/2010 |
| CN | 112397367 A | 2/2021 |
| WO | 2005104175 A1 | 11/2005 |

OTHER PUBLICATIONS

International Search Report and Written Opinion for the International Application No. PCT/US2023/013038, mailed May 30, 2023, 11 pages.

* cited by examiner

*Primary Examiner* — David E Smith
*Assistant Examiner* — Hsien C Tsai
(74) *Attorney, Agent, or Firm* — KDW FIRM PLLC

(57) ABSTRACT

A plasma doping system including a plasma doping chamber, a platen mounted in the plasma doping chamber for supporting a workpiece, a source of ionizable gas coupled to the chamber, the ionizable gas containing a desired dopant for implantation into the workpiece, a plasma source for producing a plasma having a plasma sheath in a vicinity of the workpiece, the plasma containing positive ions of the ionizable gas, and accelerating said positive ions across the plasma sheath toward the platen for implantation into the workpiece, a shield ring surrounding the platen and adapted to extend the plasma sheath beyond an edge of the workpiece, and a cover ring disposed on top of the shield ring and adapted to mitigate sputtering of the shield ring, wherein the cover ring comprises a crystalline base layer and a non-crystalline top layer.

15 Claims, 2 Drawing Sheets

COVER RING TO MITIGATE CARBON CONTAMINATION IN PLASMA DOPING CHAMBER

FIELD

Embodiments of the present disclosure relate to plasma doping systems and, more particularly, to a device for mitigating sputter contamination within plasma doping systems.

BACKGROUND

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of a wafer. The energetic ions in the beam penetrate into the bulk of the semiconductor material and are embedded into the crystalline lattice of the semiconductor material to form a region of desired conductivity.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, plasma doping systems are used for forming shallow junctions in semiconductor wafers. In a plasma doping system, a semiconductor wafer is placed on a platen within a chamber, wherein the platen is adapted to function as a cathode. An ionizable gas containing the desired dopant material is introduced into the chamber, and a high voltage pulse is applied between the platen and an inductively couple plasma source, causing formation of a plasma having a plasma sheath in the vicinity of the wafer. The applied voltage causes ions in the plasma to cross the plasma sheath and to be implanted into the wafer. The depth of implantation is related to the voltage applied to the wafer.

In plasma doping systems such as the one described above, an annular "shield ring" surrounding the platen is commonly provided. The shield ring, typically formed of silicon carbide, is positioned in a radially close-clearance relationship with a wafer disposed on the platen and is biased to extend the plasma sheath beyond the edge of the wafer. While generally effective for its intended purpose, this configuration is associated with certain shortcomings. For example, during an implantation process, ions may strike the shield ring, causing carbon atoms to be sputtered into the chamber, resulting in undesirable carbon contamination of the wafer being processed. Thus, there is a need to mitigate such contamination while preserving the functionality of the shield ring.

With respect to these and other considerations the present disclosure is provided.

BRIEF SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An embodiment of a plasma doping system in accordance with the present disclosure may include a plasma doping chamber, a platen mounted in the plasma doping chamber for supporting a workpiece, a source of ionizable gas coupled to the plasma doping chamber, the ionizable gas containing a desired dopant for implantation into the workpiece, a plasma source for producing a plasma having a plasma sheath in a vicinity of the workpiece, the plasma containing positive ions of the ionizable gas, and accelerating said positive ions across the plasma sheath toward the platen for implantation into the workpiece, a shield ring surrounding the platen and adapted to extend the plasma sheath beyond an edge of the workpiece, and a cover ring disposed on top of the shield ring and adapted to mitigate sputtering of the shield ring, wherein the cover ring comprises a crystalline base layer and a non-crystalline top layer.

Another embodiment of a plasma doping system in accordance with the present disclosure may include a plasma doping chamber, a platen mounted in the plasma doping chamber for supporting a workpiece, a source of ionizable gas coupled to the plasma doping chamber, the ionizable gas containing a desired dopant for implantation into the workpiece, a plasma source for producing a plasma having a plasma sheath in a vicinity of the workpiece, the plasma containing positive ions of the ionizable gas, and accelerating said positive ions across the plasma sheath toward the platen for implantation into the workpiece, a shield ring surrounding the platen and adapted to extend the plasma sheath beyond an edge of the workpiece, and a cover ring disposed on top of the shield ring and adapted to mitigate sputtering of the shield ring, wherein the cover ring comprises a crystalline base layer and a non-crystalline top layer.

An embodiment of shield ring assembly for a plasma doping system in accordance with the present disclosure may include a shield ring adapted to surround a platen of the plasma doping system and to extend a plasma sheath beyond an edge of a workpiece, and a cover ring disposed on top of the shield ring and adapted to mitigate sputtering of the shield ring, wherein the cover ring comprises a crystalline base layer and a non-crystalline top layer.

BRIEF DESCRIPTION OF THE DRAWINGS

The accompanying drawings illustrate example approaches of the disclosure, including the practical application of the principles thereof, as follows.

Figure 1:
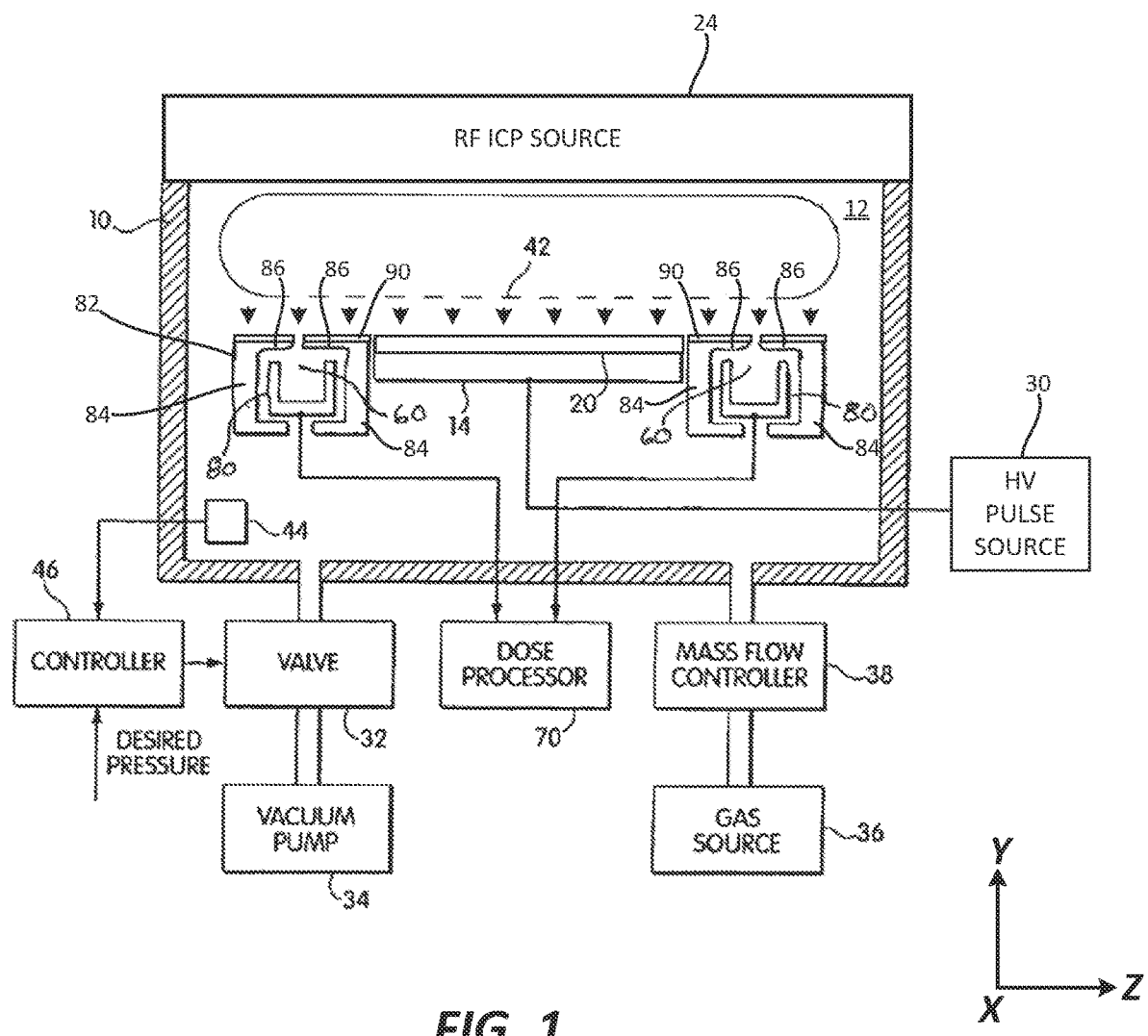
FIG. 1 is a cross-sectional side view illustrating a plasma doping system in accordance with exemplary embodiments of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Referring to FIG. 1, an exemplary embodiment of a plasma doping system in accordance with the present disclosure is shown. The system may include a plasma doping chamber 10 defining an enclosed volume 12. A platen 14 may be positioned within the chamber 10 to provide a surface for holding a workpiece, such as a semiconductor wafer 20. The wafer 20 may, for example, be clamped at its periphery to a flat surface of the platen 14. The platen 14 may support the wafer 20 and may provide an electrical connection to the wafer 20. In another embodiment, the platen 14 may include conductive pins for providing electrical connection to wafer 20. The present disclosure is not limited in this regard.

The wafer 20 may be electrically connected to a first high voltage pulse generator 30 via the platen 14, and the wafer 20 may function as a cathode. The pulse generator 30 may typically provide pulses in a range of about 20 to 20,000 volts, about 5 to 200 microseconds in duration, and at a pulse repetition rate of about 500 Hz to 20 KHz, for example. The pulse parameter values are given by way of example only and other values and ranges can be contemplated within the scope of the invention.

The enclosed volume 12 of chamber 10 may be coupled through a controllable valve 32 to a vacuum pump 34. A gas source 36 may be coupled through a mass flow controller 38 to the chamber 10. A pressure sensor 44 located within chamber 10 may provide a signal indicative of chamber pressure to a controller 46. The controller 46 may compare the sensed chamber pressure with a desired pressure input and may provide a control signal to the valve 32. The control signal my control the valve 32 so as to minimize the difference between the chamber pressure and the desired pressure. The vacuum pump 34, valve 32, pressure sensor 44, and controller 46 may constitute a closed loop pressure control system. The pressure is typically controlled in a range of about one millitorr to about 500 millitorr. The present disclosure is not limited in this regard. The gas source 36 may supply an ionizable gas containing a desired dopant for implantation into the wafer 20. Examples of ionizable gases include $BF_3$, $N_2$, Xe, Ne, He, $H_2$, $D_2$, Ar, $PF_5$, $PH_3$, $AsH_3$, $AsF_5$, $AsF_3$, and $B_2H_6$. The present disclosure is not limited in this regard. The mass flow controller 38 may regulate the rate gas is supplied to the chamber 10. The configuration shown in FIG. 1 may provide a continuous flow of process gas at a constant gas flow rate and constant pressure. The pressure and gas flow rate are preferably regulated to provide repeatable results.

During operation of the system, the wafer 20 may be positioned on the platen 14. Then the pressure control system, the mass flow controller 38, and the gas source 36 may produce the desired pressure and gas flow rate within the chamber 10. By way of example, the chamber 10 may operate with He gas at a pressure of 10 millitorr. The pulse generator 30 may apply a series of high voltage pulses to the wafer 20, causing formation of a plasma 40 between the wafer 20 and a radio frequency inductively coupled plasma (RF ICP) source 24 above the wafer 20. As known in the art, the plasma 40 contains positive ions of the ionizable gas from the gas source 36. The plasma 40 further includes a plasma sheath 42 in the vicinity of the platen 14. The electric field present between the RF ICP source 24 and the platen 14 during the high voltage pulse accelerates positive ions from the plasma 40 across the plasma sheath 42 toward the platen 14. The accelerated ions are implanted into the wafer 20 to form regions of impurity material. The pulse voltage is selected to implant the positive ions to a desired depth in the wafer 20. The number of pulses and the pulse duration are selected to provide a desired dose of impurity material in the wafer 20.

The system may further include an annular Faraday cup 80 positioned around the wafer 20 and the platen 14. The Faraday cup 80 may be positioned in an annular shield ring 82 (described in greater detail below) and may be located as close as is practical to the wafer 20 and the platen 14 and may intercept a sample of the positive ions accelerated from the plasma 40 toward the platen 14. In various alternative embodiments the Faraday cup 80 may have other positions relative to the wafer 20 to provide a measurement representative of ion current implanted into the wafer 20. The Faraday cup 80 may include a conductive enclosure having an entrance 60 facing the plasma 40.

The Faraday cup 80 may be electrically connected to a dose processor 70 or other dose monitoring circuit. Positive ions entering the Faraday cup 80 through the entrance 60 may produce a current in the electrical circuit connected to the Faraday cup 80. The electrical current is indicative of the number of positive ions received per unit time, or ion current density. The ion current density received by Faraday cup 80 may have a fixed relation to the number of ions implanted in the wafer 20 per unit time. Depending on the uniformity of the plasma 40 and the uniformity of ion acceleration toward the platen 14, the ion current per unit area received by the Faraday cup 80 may be equal to, or a fixed fraction of, the ion current per unit area implanted in the wafer 20. Since the electrical current output of the Faraday cup 80 is representative of the ion current implanted in the wafer 20, the Faraday cup 80 may provide a measurement of the ion dose implanted in the wafer 20.

The shield ring 82 may surround the platen 14 and may be biased to extend the plasma sheath beyond the edge of the wafer 20. As described previously, the Faraday cup 80 can be positioned within the shield ring 82 near the periphery of the wafer 20 and the platen 14. Side walls 84 of the shield ring 82 may include horizontal projections 86 extending over entrance 60 of the Faraday cup 80 to provide a narrow opening 87 (best shown in FIG. 2) over the Faraday cup 80. Secondary electrons can be produced by ions striking the sidewalls 88 of the Faraday cup 80 and cause discharges inside the Faraday cup 80. The narrow opening 87 can decrease the potential drop in the Faraday cup 80 and can improve electron confinement in the Faraday cup 80.

The system may further include an annular cover ring 90 disposed atop, and positioned concentric with, the shield ring 82. The shield ring 82 and the cover ring 90 may be collectively referred to herein as "the shield ring assembly." The cover ring 90 may have an inner diameter and an outer diameter equal to or nearly equal to an inner diameter and an outer diameter of the shield ring 82. The cover ring 90 may further have an annular opening 92 (best shown in FIG. 2) formed therethrough. The annular opening 92 may be aligned with, and may have a width equal to or nearly equal to a width of, the narrow opening 87 defined by the shield ring 82. The cover ring 90 may thus block accelerated ions emanating from the plasma 40 from striking the shield ring 82 while allowing the ions to enter the Faraday cup 80.

Figure 2:
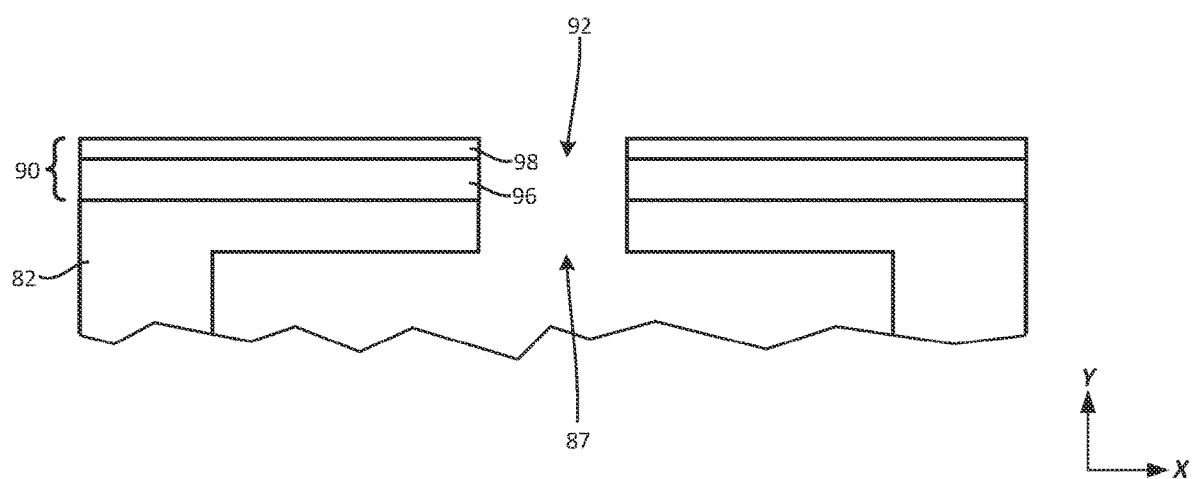
FIG. 2 is a detailed cutaway view illustrating a portion of a shield ring and cover ring of the plasma doping system shown in FIG. 1.

Referring now to FIG. 2, a detailed cutaway view illustrating a segment of the cover ring 90 and a top portion of the shield ring 82 is shown. The shield ring 82 may be formed of silicon carbide (SiC), such material being familiar to those of ordinary skill in the art as a standard material used in the construction of shield rings. The cover ring 90 may be formed primarily of silicon or another material known to have low sputter yields (as described in greater detail below). As described above, the cover ring 90 may prevent accelerated ions emanating from the plasma 40 (see FIG. 1) from striking the shield ring 82, thus preventing carbon atoms from being sputtered therefrom. Carbon contamination within the chamber 10 is resultingly mitigated or prevented and the quality of implantation processes performed within the chamber 10 is improved.

In some instances, crystalline silicon (c-Si) may be prone to "bubbling" or other forms of degradation when subjected to ionic bombardment. The cover ring 90 may thus be formed of a crystalline base layer 96 and may have an insulating, non-crystalline top layer 98 adapted to resist such bubbling or degradation. For example, in one non-limiting embodiment of the present disclosure, the top layer 98 may be formed of an oxide. Such oxide may be thermally grown on the top surface of the silicon base layer 96, may be sprayed onto the top surface of the crystalline base layer 96, or may be deposited onto the top surface of the crystalline base layer 96 using chemical vapor deposition (CVD) or atomic layer deposition (ALD). The present disclosure is not limited in this regard. In another embodiment of the present disclosure, the insulating top layer 98 may be formed by amorphizing the top of the crystalline base layer 96 using any suitable amorphization process. The amorphization process can be performed on the cover ring prior to installation on the shield ring 82, or in-situ after installation on the shield ring 82. The present disclosure is not limited in this regard. In yet another embodiment of the present disclosure, the top layer 98 may be formed of silicon nitride ($SiN_x$). The silicon nitride may be sprayed onto the top surface of the crystalline base layer 96 or may be deposited onto the top surface of the crystalline base layer 96 using chemical vapor deposition (CVD) or atomic layer deposition (ALD). The present disclosure is not limited in this regard. Thus, the insulating, non-crystalline top layer 98 may be formed by applying a separate layer of material atop the base layer 96 (e.g., as in the case of applying an oxide or silicon nitride via spraying), or by altering the composition of the top portion of the base layer 96 (e.g., as in the case of amorphization).

In various, non-limiting embodiments of the present disclosure, the top layer 98 of the cover ring 90 may have a thickness in a range of 1000 angstroms-2000 angstroms as measured along the Y-axis of the illustrated Cartesian coordinate system. Notably, if the top layer 98 is not thick enough, the underlying silicon base layer 96 will not be sufficiently protected from ionic bombardment and will be prone to bubbling or may otherwise degrade prematurely. Conversely, if the top layer 98 is too thick, it can produce numerous undesirable effects, including, and not limited to, voltage degradation/drop within the chamber 10, sheath bending, charging and arcing, etc. Thus, the specific thickness of the top layer 98 of the cover ring 90 may be tailored to the energy of the implantation process being performed (i.e., the higher the energy of the implant, the greater the thickness of the top layer 98).

The cover ring 90 can be conveniently removed and replaced, such as when the cover ring 90 is "spent" (i.e., etched or degraded beyond further usefulness), or if a cover ring formed of a different material or having a top layer (insulating layer) with a different thickness is desired. The cover ring 90 has been described above as being formed primarily of silicon. The present disclosure is not limited in this regard. In alternative embodiments, the cover ring 90 may be formed of various metallic materials known to have low sputter yields. Such metallic materials include, and are not limited to, titanium (Ti), yttrium (Y), yttrium oxide ($Y_2O_3$), etc. For example, if the wafer 20 (FIG. 1) has been implanted with titanium nitride, the cover ring 90 may be formed of titanium since the wafer 20 would be less sensitive to contamination from titanium sputtered from the cover ring 90 during a subsequent implantation process.

In summation, the embodiments described herein provide at least the following technical advantages. For a first advantage, the cover ring 90 of the present embodiments reduces the occurrence of carbon being sputter-etched from a conventional shield ring formed of silicon carbide during ion implantation processes, thus reducing carbon contamination of a wafer being processed. For a second advantage, the cover ring 90 is easily replaceable and can be implemented at a relatively low cost.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A plasma doping system comprising:
    a plasma doping chamber; a platen mounted in the plasma doping chamber for supporting a workpiece;
    a source of ionizable gas coupled to the plasma doping chamber, the ionizable gas containing a desired dopant for implantation into the workpiece;
    a plasma source for producing a plasma having a plasma sheath in a vicinity of the workpiece, the plasma containing positive ions of the ionizable gas, and accelerating said positive ions across the plasma sheath toward the platen for implantation into the workpiece;
    a shield ring surrounding the platen and adapted to extend the plasma sheath beyond an edge of the workpiece;

a Faraday cup disposed within the shield ring, the shield ring having an opening formed therein for allowing ions to enter the Faraday cup; and a cover ring disposed on top of the shield ring and adapted to mitigate sputtering of the shield ring, the cover ring having an annular opening extending entirely therethrough, the annular opening being aligned with the opening in the shield ring.

2. The plasma doping system of claim 1, wherein the cover ring is formed of silicon.

3. The plasma doping system of claim 1, wherein the cover ring comprises a crystalline base layer and a non-crystalline top layer.

4. The plasma doping system of claim 3, wherein the non-crystalline top layer is formed of an oxide.

5. The plasma doping system of claim 3, wherein the non-crystalline top layer is an amorphized portion of the crystalline base layer.

6. The plasma doping system of claim 3, wherein the non-crystalline top layer has a thickness in a range of 1000 angstroms-2000 angstroms.

7. A plasma doping system comprising:
a plasma doping chamber;
a platen mounted in the plasma doping chamber for supporting a workpiece;
a source of ionizable gas coupled to the plasma doping chamber, the ionizable gas containing a desired dopant for implantation into the workpiece;
a plasma source for producing a plasma having a plasma sheath in a vicinity of the workpiece, the plasma containing positive ions of the ionizable gas, and accelerating said positive ions across the plasma sheath toward the platen for implantation into the workpiece;
a shield ring surrounding the platen and adapted to extend the plasma sheath beyond an edge of the workpiece; and
a Faraday cup disposed within the shield ring, the shield ring having an opening formed therein for allowing ions to enter the Faraday cup; and a cover ring disposed on top of the shield ring and adapted to mitigate sputtering of the shield ring, the cover ring having an annular opening extending entirely therethrough, the annular opening being aligned with the opening in the shield ring.

8. The plasma doping system of claim 7, wherein the cover ring is formed of silicon.

9. The plasma doping system of claim 7, wherein the non-crystalline top layer is formed of an oxide.

10. The plasma doping system of claim 7, wherein the non-crystalline top layer is an amorphized portion of the crystalline base layer.

11. The plasma doping system of claim 7, wherein the non-crystalline top layer has a thickness in a range of 1000 angstroms-2000 angstroms.

12. A shield ring assembly for a plasma doping system, the shield ring assembly comprising:
a shield ring adapted to surround a platen of the plasma doping system and to extend a plasma sheath beyond an edge of a workpiece;
a Faraday cup disposed within the shield ring, the shield ring having an opening formed therein for allowing ions to enter the Faraday cup; and
a cover ring disposed on top of the shield ring and adapted to mitigate sputtering of the shield ring, the cover ring having an annular opening extending entirely therethrough, the annular opening being aligned with the opening in the shield ring, wherein the cover ring comprises a crystalline base layer and a non-crystalline top layer.

13. The plasma doping system of claim 12, wherein the cover ring is formed of silicon.

14. The plasma doping system of claim 12, wherein the non-crystalline top layer is formed of an oxide.

15. The plasma doping system of claim 12, wherein the non-crystalline top layer is an amorphized portion of the crystalline base layer.

* * * * *